United States Patent
Damberg (10) Patent No.: US 6,765,288 B2
(45) Date of Patent: Jul. 20, 2004

(54) MICROELECTRONIC ADAPTORS, ASSEMBLIES AND METHODS

(75) Inventor: Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/236,442

(22) Filed: Sep. 6, 2002

(65) Prior Publication Data

US 2004/0021211 A1 Feb. 5, 2004

Related U.S. Application Data

(60) Provisional application No. 60/401,391, filed on Aug. 5, 2002.

(51) Int. Cl.[7] .............................................. H01L 23/04
(52) U.S. Cl. ..................... 257/698; 257/778; 438/108
(58) Field of Search ................................ 257/698, 786, 257/778, 686, 777; 439/70, 71, 72, 73, 68, 77, 67; 438/108, 109, 110, 125

(56) References Cited

U.S. PATENT DOCUMENTS

| | | |
|---|---|---|
| 3,766,439 A | 10/1973 | Isaacson |
| 3,873,889 A | 3/1975 | Leyba |
| 4,781,601 A | 11/1988 | Kuhl et al. |
| 4,941,033 A | 7/1990 | Kishida |
| 4,982,265 A | 1/1991 | Watanabe et al. |
| 5,172,303 A | 12/1992 | Bernardoni et al. |
| 5,198,888 A | 3/1993 | Sugano et al. |
| 5,222,014 A | 6/1993 | Lin |
| 5,224,023 A | 6/1993 | Smith et al. |
| 5,247,423 A | 9/1993 | Lin et al. |
| 5,345,205 A | 9/1994 | Kornrumpf |
| 5,397,916 A | 3/1995 | Normington |
| 5,422,435 A | 6/1995 | Takiar et al. |
| 5,426,563 A | 6/1995 | Moresco et al. |
| 5,455,740 A | 10/1995 | Burns |
| 5,598,033 A | 1/1997 | Behlen et al. |
| 5,615,824 A | 4/1997 | Fjelstad et al. |
| 5,632,631 A | 5/1997 | Fjelstad et al. |
| 5,646,446 A | 7/1997 | Nicewarner, Jr. et al. |
| 5,776,797 A | 7/1998 | Nicewarner, Jr. et al. |
| 5,789,815 A | 8/1998 | Tessier et al. |
| 5,802,699 A | 9/1998 | Fjelstad et al. |
| 5,805,422 A | 9/1998 | Otake et al. |
| 5,951,305 A | 9/1999 | Haba |
| 5,956,234 A | 9/1999 | Mueller |
| 5,980,270 A | * 11/1999 | Fjelstad et al. |
| 6,014,320 A | 1/2000 | Mahon et al. |
| 6,086,386 A | 7/2000 | Fjelstad et al. |
| 6,200,143 B1 | 3/2001 | Haba et al. |
| 6,300,679 B1 | * 10/2001 | Mukerji et al. |

OTHER PUBLICATIONS

U.S. patent application Ser. No. 10/077,388, filed Feb. 15, 2002.

* cited by examiner

*Primary Examiner*—S. V. Clark
(74) *Attorney, Agent, or Firm*—Lerner, David, Littenberg, Krumholz & Mentlik, LLP (57) ABSTRACT

A first microelectronic element such as a semiconductor chip is mounted to a circuit board using an adaptor which has a region extending beneath the first microelectronic element and an additional region which may be folded over the first microelectronic element or which may project laterally from the first microelectronic element. The adaptor includes a functional element in the additional region, such as a further microelectronic element or an array of terminals for mounting another element. The assembly provides the benefits of a stacked chip assembly or other mustachio module, but can be made without the need for a special prepackaged stacked chip assembly. The adaptor can be configured so that it does not materially increase the height of the first microelectronic element above the circuit board.

41 Claims, 8 Drawing Sheets

MICROELECTRONIC ADAPTORS, ASSEMBLIES AND METHODS

CROSS-REFERENCE TO RELATED APPLICATIONS

The present application claims benefit of U.S. Provisional Patent Application Serial No. 60/401,391, filed Aug. 5, 2002, the disclosure of which is hereby incorporated by reference herein.

BACKGROUND OF THE INVENTION

The present invention relates to microelectronic assemblies and to components and methods used for making the same.

Microelectronic elements such as semiconductor chips ordinarily are mounted on circuit panels such as circuit boards. For example, a packaged semiconductor chip may have an array of bonding contacts on a bottom surface of the package. Such a package can be mounted to a corresponding array of bonding contacts exposed at a top surface of a circuit board by placing the package on the circuit board with the bottom surface of the package facing downwardly and confronting the top surface of the circuit board, so that each bonding contact on the package is aligned with a corresponding bonding contact on the circuit board. Masses of a conductive bonding material, typically in the form of solder balls, are provided between the bonding contacts of the package and the bonding contacts of the circuit board. In typical surface-mounting techniques, solder balls are placed on the bonding contacts of the package before the package is applied to the circuit board.

Ordinarily, numerous microelectronic elements are mounted side-by-side on the circuit board and interconnected to one another by electrically conductive traces connecting the various bonding contacts. Using this conventional approach, however, the circuit board must have an area at least equal to the aggregate area of all of the microelectronic elements. Moreover, the circuit board must have all of the traces needed to make all of the interconnections between microelectronic elements. In some cases, the circuit board must include many layers of traces to accommodate the required interconnections. This materially increases the cost of the circuit board. Typically, each layer extends throughout the entire area of the circuit board. Stated another way, the number of layers in the entire circuit board is determined by the number of layers required in the area of the circuit board having the most complex, densely packed interconnections. For example, if a particular circuit requires six layers of traces in one small region but only requires four layers in the remainder of the circuit board, the entire circuit board must be fabricated as a six-layer structure.

These difficulties can be alleviated to some degree by connecting related microelectronic elements to one another using an additional circuit panel so as to form a sub-circuit or module which, in turn, is mounted to the main circuit board. The main circuit board need not include the interconnections made by the circuit panel of the module. It is possible to make such a module in a "stacked" configuration, so that some of the chips or other microelectronic elements in the module are disposed on top of other chips or microelectronic elements in the same module. Thus, the module as a whole can be mounted in an area of the main circuit board less than the aggregate area of the individual microelectronic elements in the module. However, the additional circuit panel and the additional layer of interconnections between this circuit panel and the main circuit board consume additional space. In particular, the additional circuit panel and additional layer of interconnections between the additional circuit panel and the main circuit panel add to the height of the module, i.e., the distance by which the module projects above the top surface of the main circuit board. This is particularly significant where the module is provided in a stacked configuration and where low height is essential, as, for example, in assemblies intended for use in miniaturized cellular telephones and other devices to be worn or carried by the user. Such a module may also require a complicated socket or connector between the module circuit panel and the circuit board.

The additional space consumed by mounting prepackaged semiconductor chips on a separate module circuit panel can be saved by integrating the circuit panel of the module with a part of the package itself, commonly referred to as a package substrate. For example, several bare or unpackaged semiconductor chips can be connected to a common substrate during the chip packaging operation. Packages of this nature can also be made in a stacked arrangement. Such multi-chip packages can include some or all of the interconnections among the various chips in the package and can provide a very compact assembly. The main circuit board can be simpler than that which would be required to mount individual packaged chips in the same circuit. However, this approach requires unique packages for each combination of chips to be included in the package. For example, in the cellular telephone industry, it is a common practice to use the same field programmable gate array ("FPGA") or application specific integrated circuit ("ASIC") with different combinations of static random access memory ("SRAM") and flash memory so as to provide different features in different cellular telephones. This increases the costs associated with producing, handling and stocking the various packages.

SUMMARY OF THE INVENTION

One aspect of the invention provides a circuit panel assembly which includes a circuit panel such as a printed circuit board having a top surface and a first microelectronic element disposed on the circuit panel, the first microelectronic element having a bottom surface overlying the top surface of said circuit panel and defining a gap therebetween. The assembly according to this aspect of the invention also includes an adaptor having a substrate including a first region. The substrate has oppositely-directed inner and outer surfaces in said first region. The first region of the substrate first extends at least partially in the gap between said bottom surface of said first microelectronic element and said top surface of said circuit panel with said inner surface facing upwardly toward the bottom surface of the first microelectronic element. The adaptor also includes a functional element as, for example, an array of terminals for connection to a further element disposed on the substrate outside of the first region. For example, the functional element of the adaptor may be disposed in an additional region which may be folded over the top of the first microelectronic element. Where the functional element includes terminals, one or more further microelectronic elements can be disposed above the first microelectronic element and connected to the terminals, to provide a stacked arrangement. In other variants, the additional region may project laterally away from the first microelectronic element.

The adaptor may have apertures in the first region, and socket contacts aligned with at least some of these apertures. Connection elements such as solder balls or surfacemountable leads on the first microelectronic element may extend through the apertures, and at least some of the connection elements may contact the socket contacts of the adaptor.

The assembly can be made using the techniques normally used to handle and secure packaged chips as, for example, placement, soldering and reflow; there is no need to prepare special stacked chip subassemblies in a chip packaging plant. Nonetheless, the preferred embodiments of the assembly can provide the benefits normally achieved by prepackaged stacked chip assemblies, such as compactness and simplified wiring layouts in the circuit board. In this arrangement, the functional element of the adaptor is connected to the first microelectronic element, to the contact pads of the circuit board, or both, by the socket contacts of the adaptor. However, because the connection elements extend through the adaptor to the circuit board, the presence of the adaptor need not substantially increase the height of the first microelectronic element above the circuit board.

In another arrangement, the adaptor has conductive attachments in the first region as, for example, pads overlying apertures in the adaptor substrate rather than the socket contacts discussed above. The functional element is electrically connected to at least some of these conductive attachments. The first microelectronic element is connected to the conductive attachments by internal connection elements such as thin solder lands, whereas mounting elements as, for example, solder balls, extend between said first conductive attachments and said contact pads. In this arrangement as well, the mounting and connection elements most preferably are arranged to minimize the height of the first microelectronic element above the circuit board. Most preferably, the bottom surface of the first microelectronic element is disposed at a height above the top surface of said circuit panel less than the sum of the height of the internal connection elements, the height of the mounting elements and the thickness of first connection region of the adaptor. For example, the mounting elements may extend at least partially within apertures within the adaptor, so that the height of the mounting elements is at least partially concealed within the thickness of the adaptor substrate. Here again, the assembly can be made using techniques similar to those used in mounting packaged chips to a circuit board as, for example, surface mounting techniques, so that there is no need for special prepackaged stacked chip assemblies.

Further aspects of the invention provide adaptors suitable for use in the aforementioned assemblies and assembly methods.

DETAILED DESCRIPTION

An adaptor in accordance with one embodiment of the invention includes a sheetlike, flexible substrate 20 having an inner surface 22 and an oppositely-directed, outer surface 24. As used in this disclosure, the term "sheetlike" refers to an element which has thickness substantially less than its length and width. Substrate 20 may be formed from essentially any material used in formation of flexible circuits as, for example, unreinforced or reinforced polyimides or BT resin. Most typically, the substrate is about 25–75 microns thick. Other materials and thicknesses may be employed. As discussed below, during fabrication of an assembly incorporating the adaptor in accordance with this embodiment, the substrate will be flexed in only one region, and, accordingly, only that region needs to be flexible in this embodiment. Thus, other regions of the substrate may be substantially rigid.

Figure 1:
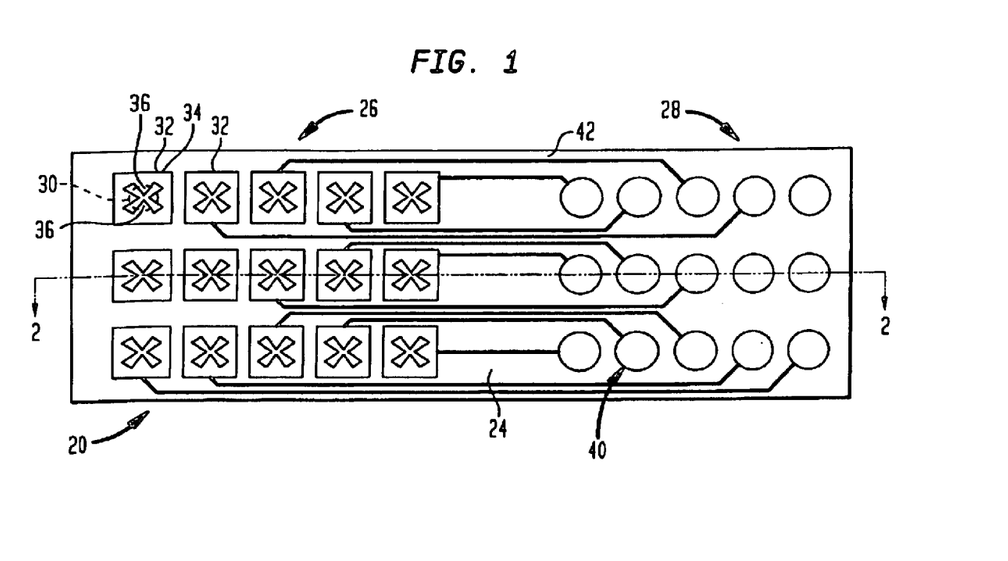
FIG. 1 is a diagrammatic bottom plan view of a component in accordance with one embodiment of the invention.

Substrate 20, as seen in plan view in FIG. 1, is generally in the form of an elongated strip and has a first socket region 26 adjacent the end of the strip towards the left as seen in FIG. 1, and has an additional or attachment region 28 adjacent the opposite end of the strip. The substrate has an array of apertures 30 extending through it, from the inner surface 22 to the outer surface 24 in the first socket region 26.

Figure 2:
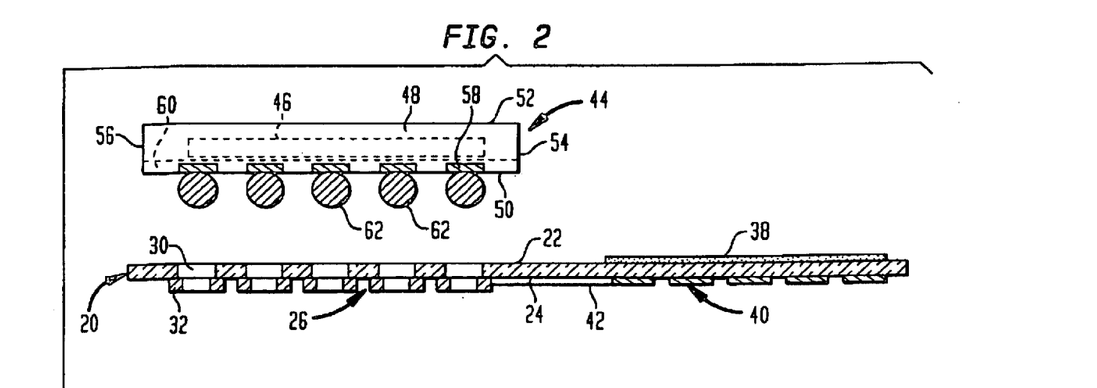
FIG. 2 is a diagrammatic sectional view taken along line 2—2 showing the component of FIG. 1 in conjunction with a microelectronic element during one stage of manufacture.

The adaptor further includes a set of first socket contacts 34 formed from one or more electrically conductive materials, typically metals. Each first socket contact 32 is aligned with one of the apertures 30. Each first socket contact is adapted to engage a solder ball advanced through the corresponding aperture 30 and is also adapted to allow the solder ball to project through the aperture and through the contact itself. These contacts may be generally similar to the contacts disclosed in U.S. Pat. Nos. 5,632,631; 5,980,270; 5,802,699; 5,615,824; and 6,200,143 the disclosures of which are hereby incorporated by reference herein. In the particular embodiment depicted, each socket contact 32 is generally in accordance with certain preferred embodiments shown in the aforementioned '631, '824 and '270 patents; each socket contact includes a main structure 34 having a hole corresponding to the aperture 30 and four tabs 36 which project inwardly, partially across the hole and partially across the aperture 30. As disclosed in certain of the aforementioned patents, the socket contacts may incorporate features such as asperities and hard metal elements to facilitate engagement with the solder balls and may have areas that are not wettable by the solder or other joining material, that is to be used with the socket contacts. Socket contacts 34 in the embodiment of FIGS. 1 and 2 are disposed on the outer or bottom surface 24 of substrate 20.

The adaptor further includes a layer of an adhesive 38 overlying the inner surface 22 of substrate 20 in attachment area 28. Adhesive 38 may be, for example, an epoxy or a so-called "dry pad" adhesive arranged to remain solid until raised to an elevated temperature and then promptly form a bond to a mating surface.

The adaptor also includes an additional functional element in the form of an array of terminals 40 disposed on the outer surface 24 of the substrate in the attachment region 28. As used in this disclosure, the term "functional element" refers to an element which itself can perform an electrical function as, for example, a passive component such as a resistor, capacitor or inductor, a unit incorporating several passive devices, commonly referred to as a "passive chip", or an active semiconductor component such as a semiconductor chip including numerous active devices with or without passive devices, and also refers to an element which can be used to make connections to an additional electronic device or element as, for example, an array of terminals.

At least some of terminals 40 are connected to at least some of the first socket contacts 32 by traces 42 extending along the substrate 20. Some of the traces are omitted for clarity of illustration in FIG. 1. Traces 42 and terminals 40 may be formed from conventional materials used in flexible circuits, as, for example, copper and copper-based alloys, with a thin layer of gold or other non-reactive, readily-solderable metal on the exposed surfaces of terminals 40. A solder mask layer (not shown) desirably overlies the outer surface 24 of the adaptor and also covers traces 24. The solder mask layer has openings aligned with terminals 40 so that the terminals remain exposed at the outer surface 24 of the substrate. As used in this disclosure, a terminal or other conductive feature is regarded as "exposed at" a surface of a dielectric element where the terminal is arranged so that all or part of the conductive feature can be seen by looking at such surface. In the particular embodiment illustrated, terminals 40 project slightly from outer surface 24, but this is not essential; the terminals 40 may be recessed within apertures extending to the outer surface, or even provided on the inner surface and aligned with apertures extending through the dielectric to the outer surface.

In an assembly method according to a further embodiment of the invention, the adaptor is assembled with a first microelectronic element 44. Microelectronic element 44 may be a "bare" semiconductor chip or, preferably, a packaged semiconductor chip incorporating the active semiconductor elements or die 46 in a protective package 48. The first microelectronic element as a whole has a bottom surface 50, a top surface 52 and edges 54 and 56 extending between the top and bottom surfaces. The microelectronic element further includes an array of bonding contacts 58 exposed at the bottom surface 50 of the element. For example, where the first microelectronic element is a semiconductor chip in a ball grid array package, the bottom surface 50 may be defined by a package substrate 60 and bonding contacts 58 may be provided as conductive elements on this substrate. The bonding contacts are electrically connected to the active semiconductor chip 46 by internal leads (not shown). The edges and top surface of the microelectronic element may be defined by an encapsulant covering the active semiconductor or die 46. Such packages can be made with numerous different internal configurations. For example, the active element or die 46 may be mounted "face-up" so that the contacts of the active semiconductor element or die 46 face upwardly, away from the package substrate 60 or, alternatively, "face-down" so that the active die contacts face toward the package substrate. Optionally, microelectronic element 44 may have bonding contacts 58 which are moveable with respect to the active semiconductor element or die 46.

Figure 3:
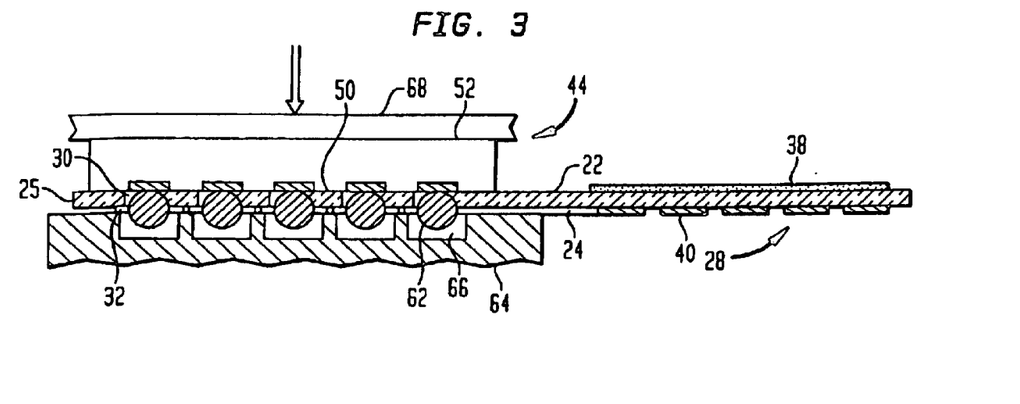
FIG. 3 is a view similar to FIG. 2 showing the component and element of FIG. 2 during a later stage of manufacture.
Figure 5:
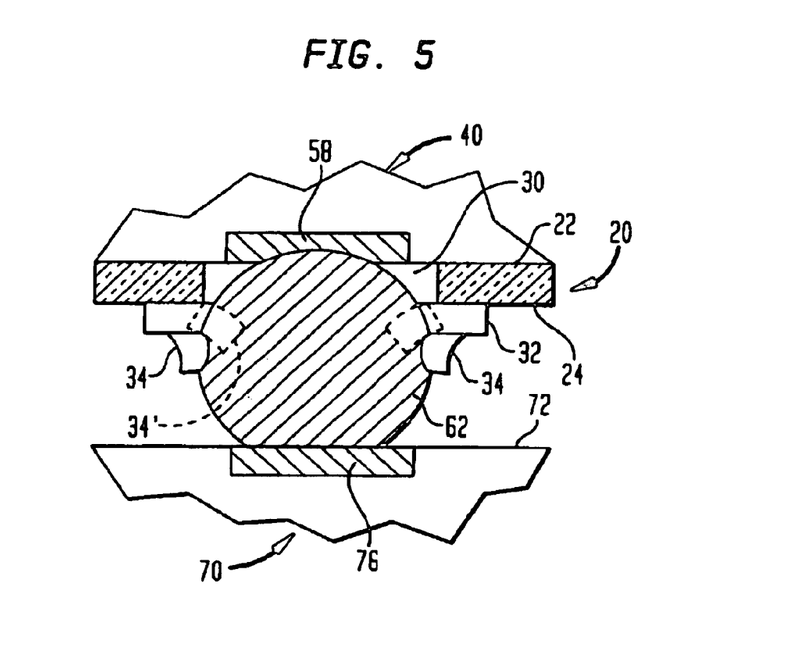
FIG. 5 is a detailed view on an enlarged scale of the area indicated in FIG. 4.

The microelectronic element is provided with an array of connecting elements in the form of solder balls 62. The solder balls are attached to bonding pads 58 and project downwardly from the bottom surface 50 of the microelectronic element. The solder balls may be applied by conventional processes used in surface-mounting technology. For example, the solder balls may be bonded to the bonding contacts 58 by reflowing or melting the solder balls when the balls are applied. The microelectronic element 44, with connecting elements or solder balls 62, is arranged over the inner surface 22 of the adaptor substrate in the first socket region 26, so that the bonding contacts 58 and connecting elements or solder balls 62 are aligned with the apertures 30 in the adaptor substrate and, hence, with the socket contacts 32. The microelectronic element and adaptor are then urged toward one another, as depicted in FIG. 3. For example, the outer surface 24 of the adaptor substrate may be supported by a resilient element or by a temporary fixture 64 having openings 66 larger than the solder balls 62 arranged in an array corresponding to the array of apertures 30 and socket contacts 32. The top or rear surface 52 of the microelectronic element 44 may be engaged by another fixture 68. In this manner, the microelectronic element is advanced toward the adaptor substrate so that the bottom surface 50 of the microelectronic element approaches or engages the top surface 22 of the adaptor substrate. The connecting elements or solder balls pass through the apertures 30 in the substrate and engage the socket contacts 32. As best seen in FIG. 5, at this stage of the process, the tabs 34 of the socket contacts desirably bend downwardly as the solder balls 62 pass through the socket contacts.

Figure 4:
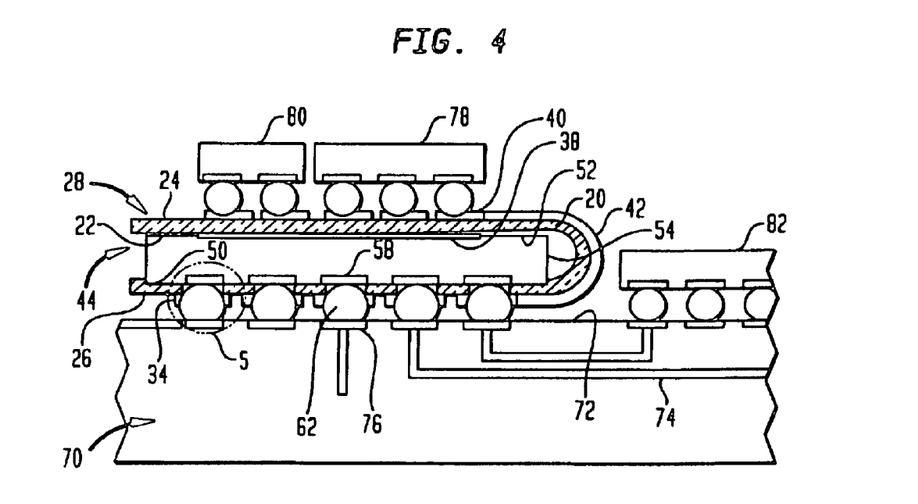
FIG. 4 is a further diagrammatic sectional elevational view showing the component and element of FIGS. 1–3 in an assembly with additional elements.

In the next stage of the process, substrate 20 is folded to the configuration depicted in FIG. 4. In this configuration, the substrate extends outwardly beyond one edge 54 of microelectronic element 44 and upwardly along that edge. The attachment area 28 of the substrate overlies the top or rear surface 52 of the first microelectronic element 44. The inner surface 22 in the attachment region faces downwardly and confronts the top surface of the microelectronic element, whereas the outer surface 24 in the attachment region faces upwardly. Thus, terminals 40, which are exposed at the outer surface 24, are accessible from the top of the first microelectronic element. The inner surface 22 is secured to the top surface 52 of the microelectronic element by adhesive 38. The substrate may be folded to this configuration simply by bending the substrate around the edge of the microelectronic element or by bending the substrate around a temporary tool or fixture (not shown).

The microelectronic element and adaptor may be handled and placed onto a circuit board 70 or other circuit panel having a top surface 72 using standard surface-mounting techniques. In accordance with standard surface-mounting techniques, the connecting elements or solder balls 62 are aligned with bonding contacts 76 exposed at the top surface of the circuit board, and the solder balls are reflowed so as to bond the solder balls to bonding contacts 76 and thus bond contacts 76 to the corresponding bonding contacts 58 on the bottom surface of the microelectronic element 44. Typically, a flux is applied to aid the solder reflow process. During reflow, the solder in balls 62 forms a metallurgical bond with socket contacts 32. As best seen in FIG. 5, the prongs 34 of the socket contacts may penetrate into the individual solder balls, as schematically depicted at 34'. The socket contacts may thus provide additional reinforcement within the solder balls in the finished assembly.

In this condition, first microelectronic element 44 sits on the circuit panel in substantially the same position as if the adaptor were not present. The first socket region 26 of adaptor substrate lies in the gap between the bottom surface 50 of the first microelectronic element and the top surface 72 of the circuit board. The height of the microelectronic element above the top surface 72 of the circuit panel may be nearly or exactly the same as if the adaptor were not present. The exposed terminals 40 of the adaptor provide an auxiliary mounting surface on top of element 44. A second microelectronic element 78 and a third microelectronic element 80 may be mounted on the terminals 40, again using standard surface-mounting techniques. All of the operations involved in assembling the adaptor to the first microelectronic element mounting the adaptor to the circuit board and assembling the further microelectronic elements to the terminals can be performed as part of a "board stuffing" operation used to mount microelectronic elements on a circuit board.

Other microelectronic elements 82 may be mounted on the top surface of the circuit board in the normal manner. First microelectronic element 44 is connected to these additional elements by traces 74 within and on the circuit board 70. The second and third microelectronic elements 78 and 80 are connected to the first microelectronic element 44 through the terminals 40, traces 42 and socket contacts 32 of the adaptor. The second and third microelectronic elements are also connected to appropriate contact pads 76 of the circuit board, and, hence, to other elements to other elements of the circuit, by the terminals 40, traces 42 and socket contacts 34 in conjunction with the connecting elements or solder balls which serve to connect the first microelectronic element to the circuit board.

The assembly operation can be repeated numerous times to produce numerous circuit assemblies. The operation can be varied by varying the second and third microelectronic elements 78 and 80 used with the same type of first microelectronic element 44. For example, in fabricating cellular telephones, different types of static random access memory or SRAM and different types or sizes of flash memory may be provided as the second and third microelectronic elements in different units, all of which employ the same baseband ASIC or FPGA. The cellular telephone manufacturer may purchase standard chips in standard packages. The configuration of the adaptor may be varied to accommodate different second and third microelectronic elements.

The entire assembly is compact, in that the second and third microelectronic elements 78 and 80 do not occupy any additional area on the board top surface. Further, the assembly has a relatively low height. Although the second and third microelectronic elements are depicted in FIG. 4 as mounted to the terminals by a ball grid array, other types of mountings may be employed. For example, the mountings for these elements may include relatively thin layer of solder in a so-called "land grid array" to further minimize the overall height of the assembly above the board top surface. Other types of interconnections may be employed, as, for example, wire-bonded or leaded interconnections.

The joints between the second and third microelectronic elements 78 and 80 and the adaptor are subjected to relatively low stress because the underlying first microelectronic element 44 typically has a coefficient of thermal expansion close to those of the second and third microelectronic elements. For example, a typical copper and epoxy circuit board 70 may have a coefficient of thermal expansion on the order of 16–18 ppm/° C., whereas the coefficient of expansion of the first microelectronic element 44, which is an aggregate of the coefficients of thermal expansion of the die (about 2–3 ppm/° C.) and the epoxy over-molding, and hence would be somewhat less than that of the circuit board, as, for example, about 8 ppm/° C. As mentioned above, the first microelectronic element may include provisions to allow the bonding contacts 58 to move relative to the die 46 and thus relieve differences in expansion between the circuit board 70 and the die. Where this arrangement is employed, the adaptor does not substantially restrict movement of the bonding contacts. Some or all of the difference in thermal expansion between the die in first element 44 and circuit board 70 may be accommodated by deformation of the connecting elements or solder balls 62. Because the adaptor extends around these elements and does not add height to these elements, relatively large solder balls can be used to enhance reliability of this connection without unduly increasing the overall height of the assembly.

The socket contacts 32 can be designed to enhance the structure of the solder balls 62 so that they can better resist strain due to CTE mismatch between the die 44 and the circuit board 70. In particular, it is desirable for the socket contacts to enhance the regions of the solder balls near the junctions of the solder balls with bonding contacts 58, near the junctions of the solder balls with the contact pads of the circuit board, or both. Reinforcing one or both of these regions, commonly referred to as fillet regions of the solder balls 62, can provide enhanced resistance to forces that could otherwise cause premature failure of the connections.

Because the second and third microelectronic elements 78 and 80 are interconnected with the first element through the adaptor, the main circuit board 70 need not include layers of traces to make these interconnections. This simplifies the layout of the main circuit board and, in some cases, can reduce the number of layers required in the board as a whole.

In a variant of the manufacturing process discussed above, the second and third microelectronic elements 78 and 80 may be assembled to the adaptor and bonded to terminals 40 before the first microelectronic element and adaptor are assembled to the main circuit board. Indeed, the second and third microelectronic elements may be bonded to the adaptor before the adaptor is folded or may be supplied as part of the adaptor.

Figure 6:
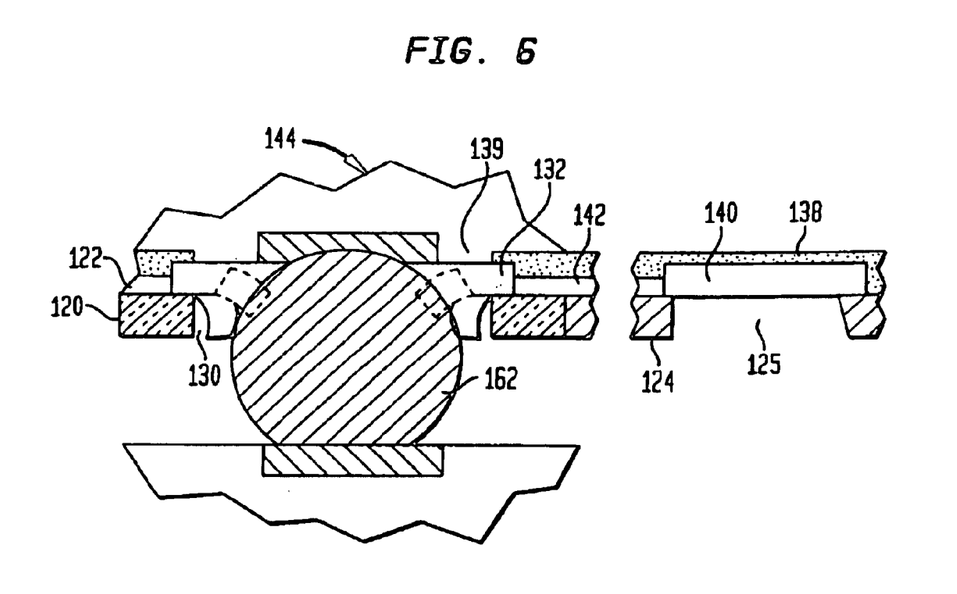
FIG. 6 is a view similar to FIG. 5 but depicting a component according to a further embodiment of the invention.

The adaptor discussed above with reference to FIGS. 1–4 has socket contacts on the outer surface 24 of the dielectric substrate 20 and has the terminals and traces also disposed on the outer surface. In a further variant (FIG. 6), the socket contacts 132, traces 142 and terminals 140 may be disposed on the inner surface 122 of the dielectric substrate 120. Here again, the socket contacts are aligned with apertures 130 in the dielectric substrate. When the first microelectronic element 144 is assembled to the adaptor, the connecting elements or solder balls 162 project through the socket contacts 132 and through the apertures 130, as depicted in FIG. 6. Also, the terminals 140 are exposed to the outer surface 124 of the substrate through holes 125 in the substrate aligned with the terminals. The adhesive 138 may be provided as a "dry pad" or solid adhesive layer overlying the terminals on the inner surface 122 of the substrate. Also, the adhesive 138 may extend into the socket region and may overlie the entire inner surface of the substrate. The dry pad may have apertures 139 aligned with the apertures 130 and socket contacts 132. In this embodiment, the dry pad acts as masking or anti-shorting layer to protect the traces from accidental contact with the edges of the chip or with one another when the substrate is folded.

Figure 7:
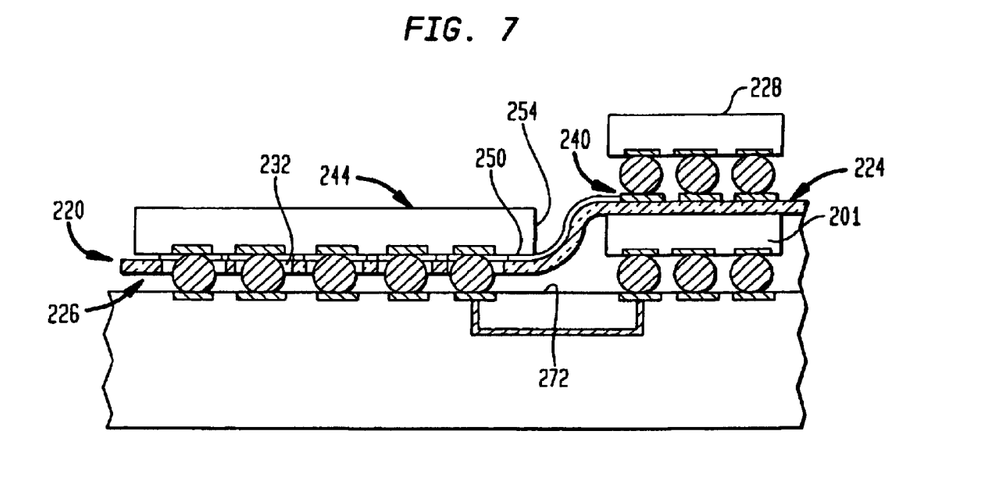
FIG. 7 is a diagrammatic, partially sectional view depicting an assembly in accordance with a further embodiment of the invention.

An assembly according to yet another embodiment of the invention (FIG. 7) includes an adaptor having a similar flexible substrate 220 and first socket contacts 232 in a socket region 226. Here again, the socket region extends into the gap between the bottom surface 250 of the first microelectronic element and the top surface 272 of the circuit board. In this embodiment as well, the adaptor includes a functional element in the form of terminals 240 in an attachment region 224 of the substrate, remote from the socket region 226. Here again, the attachment region projects outwardly beyond an edge 254 of the first microelectronic element 244. However, the attachment region is not folded back over the top of the first microelectronic element. Instead, the attachment region is extended over a neighboring element 201 on the circuit board. Once again, the second microelectronic element 278 may be mounted on the attachment region of the adaptor. In further variance, attachment regions can be provided so as to overlie more than one additional element on the circuit board and can project outwardly from more than one edge of the first microelectronic element.

Figure 8:
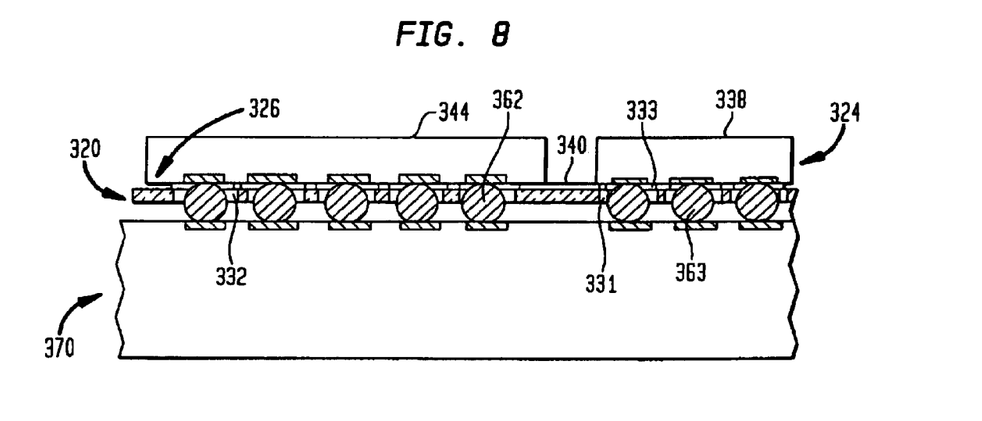
FIG. 8 is a view similar to FIG. 7 but depicting an assembly according to yet another embodiment of the invention.

An assembly according to yet another embodiment of the invention shown in FIG. 8 includes an adaptor having a substrate 320 with a first socket region 326 and first socket contacts 332 similar to the first socket contacts discussed above. However, the attachment region 324 of the substrate has terminals in the form of a second set of socket contacts 333 similar to the first socket contacts and has apertures 331 extending through the substrate in this region, in alignment with the second socket contacts. The second socket contacts 333 are connected via traces 340 on the substrate of the adaptor to the first socket contacts. In this assembly, the connecting elements 362 of the first microelectronic element 344 extend through the first socket contacts 332. The second microelectronic element 378 is mounted to the adaptor in substantially the same way as the first microelectronic element, so that second connecting elements 363 such as solder balls associated with the second microelectronic element extend through the holes 331 in the attachment region of the substrate and engage the second socket contacts. Both of these microelectronic elements 344 and 378 may be assembled to the adaptor in the manner discussed above with reference to FIG. 3, and the entire assembly then may be mounted on a circuit panel 370 so as to engage the connecting elements 362 and 363 of both microelectronic elements with the circuit panel. Because the first and second microelectronic elements 344 and 378 are interconnected through traces 340 of the adaptor, the circuit panel need not incorporate the traces required for such interconnection and, hence, can be simpler and, in some cases, may incorporate fewer layers than would otherwise be required. Here again, presence of the adaptor does not add to the height of the assembly.

Figure 9:
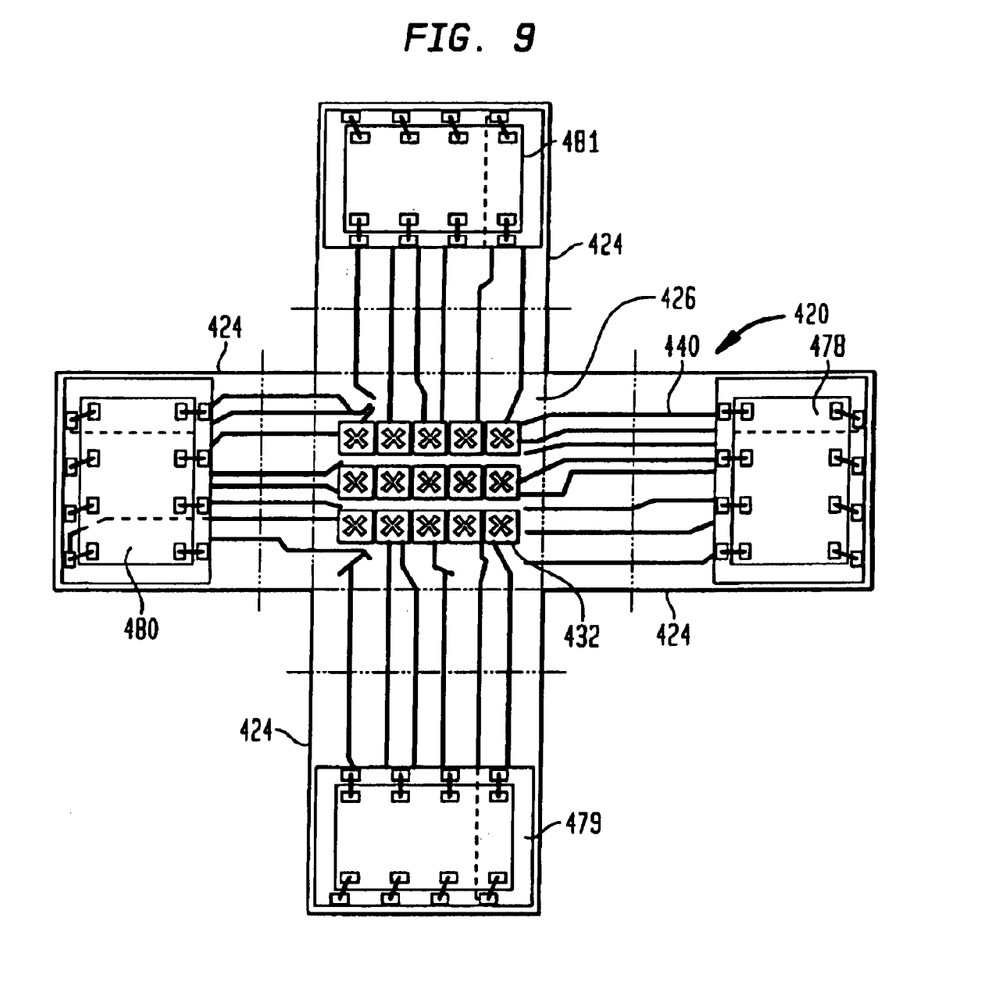
FIG. 9 is a diagrammatic top plan view of a component in accordance with yet another embodiment of the invention.
Figure 10:
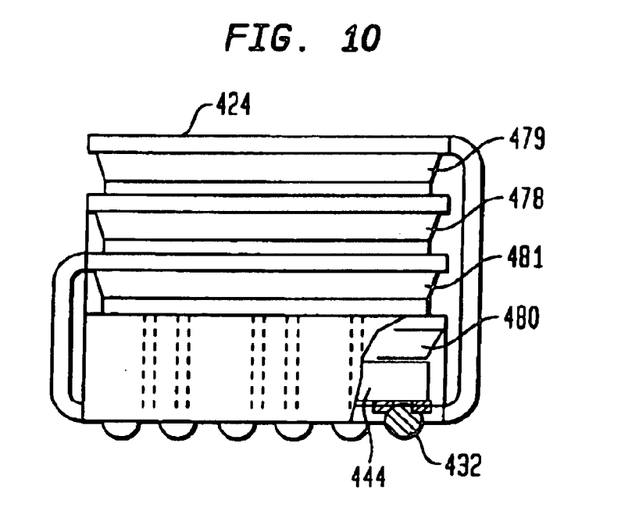
FIG. 10 is a diagrammatic, partially sectional elevational view of a subassembly made using the component of FIG. 9.

The component depicted in FIG. 9 incorporates a substrate 420 having a first socket region 426 formed as a central panel of a generally cruciform shape and having additional or attachment regions 424 formed as arms of the cruciform shape projecting outwardly from the central panel. In this embodiment, the adaptor is prefabricated with functional elements in the form of additional semiconductor chips 478, 479, 480 and 481 pre-connected to traces 440 extending to the first socket contacts 432 in the socket region 426. The particular embodiment shown has the first socket contacts 432, traces 440 and additional microelectronic elements 478–481, all mounted on the inner surface of the substrate. Here again, a microelectronic element such as element 440 is assembled to the adaptor so that connecting elements 462 on the microelectronic element project through the first socket contacts. As shown in FIG. 10, each arm of the adaptor is folded so as to bring the various additional regions 424 over the first microelectronic element 444 and stack the various additional microelectronic elements over the first microelectronic element. Such a sub-assembly may be mounted onto a circuit board. The adaptor in accordance with this embodiment of the invention provides advantages similar to those achieved in the stacked package disclosed in commonly assigned, co-pending U.S. patent application Ser. No. 10/077,388, filed Feb. 15, 2002, the disclosure of which is also incorporated by reference herein. For example, the traces connecting the first microelectronic element and socket contacts 432 to each of the microelectronic elements are of equal or nearly equal length, so that propagation times of signals to the various additional microelectronic elements 478–481 are substantially equal. However, the first microelectronic element 444 may be provided in a standard package. The arrangement of FIGS. 9 and 10 may be made with less than four or more than four additional regions. For example, if only two additional regions are provided, these may be provided on opposite sides of the central or first socket region 426. Regardless of the number of such additional regions, the additional regions may be folded on top of each other as shown in FIG. 10, or may extend outwardly from the central panel as shown and described in reference to FIGS. 7 and 8.

Figure 11:
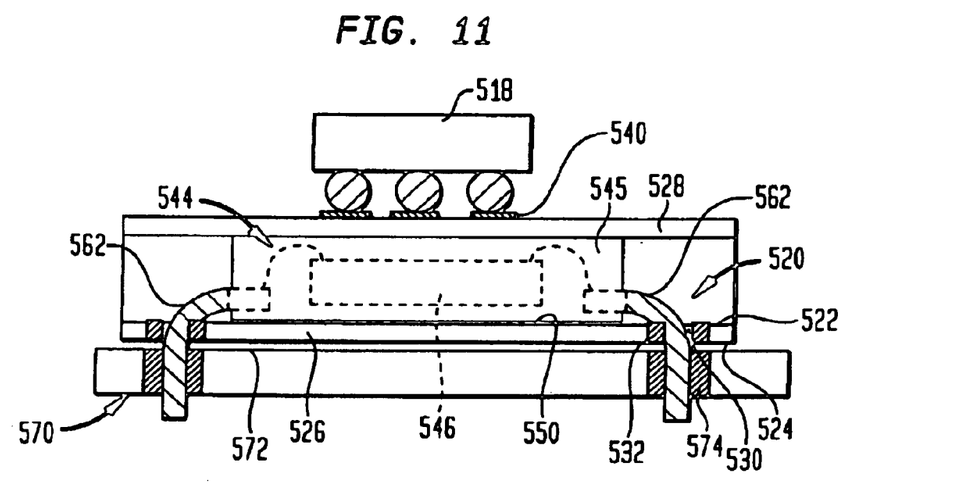
FIG. 11 is a partially sectional, elevational view of an assembly in accordance with yet another embodiment of the invention.

The connecting elements which link the first microelectronic element to the circuit board need not be solder balls or other masses of bonding material. In the embodiment of FIG. 11, the first microelectronic element 544 incorporates a semiconductor die 546 mounted in a lead frame-type package which incorporates an epoxy over-molding 545 encapsulating the active die and metallic leads 562 projecting out of edges of the over-molding and extending downwardly beyond the bottom surface 550 of the over-molding. In this arrangement, the adaptor substrate 520 has apertures 530 extending through it from its inner surface 522 to its outer surface 524. Socket contacts in the form of metallic via liners 532 are provided in these apertures. The apertures 530 and socket contacts are provided in a socket region 526 of the substrate. Here again, the socket region 526 of the substrate lies at least in part beneath the first microelectronic element 544, in the gap between the bottom surface 550 of the microelectronic element and the top surface 572 of a circuit board 570 when the first microelectronic element is mounted on the circuit board. The leads 562 of the lead frame package extend through the apertures in the socket region of the substrate and engage the socket contacts 532. The leads may be soldered to the socket contacts or vias 532 of the adaptor. Here again, an additional region 528 of the substrate extends outside of the gap between the microelectronic 544 and the circuit board, so that an additional microelectronic element 578 can be engaged with terminals 540 on the additional or attachment region 528. In this embodiment, the adaptor substrate 520 is folded (about an axis parallel to the plane of the drawing) to place the additional region 528 over the top surface 552 of the first microelectronic element 544. Here again, the additional microelectronic element may be sub-assembled to the adaptor before or after mounting the first microelectronic element and adaptor to the circuit board. The circuit board has contact elements arranged to make connection with the leads 562 of the first microelectronic element, as, for example, pads 574 arranged for surface mounting of the leads or via holes 575 extending through the circuit board with appropriate via liners for through-board solder mounting the lead frame package. Although both pads 574 and via holes 575 are depicted in FIG. 11, in practice the board typically would include one or the other, and not both. In a further variant, the same solder which connects leads 562 to contact elements 574 or 575 may connect the leads to the socket contacts 532 of the adaptor.

An assembly according to a further embodiment of the invention (FIG. 12) includes an adaptor having a dielectric body 620 generally similar to the adaptor discussed above with reference to FIGS. 1–4. However, the adaptor of FIG. 12 includes a first or bottom connection region 626 and an additional region 628 remote from region 626. Here again, the adaptor body 620 has an inner surface 622 and an outer surface 624. The first connection region 626 extends in a gap between the first microelectronic element 644 and the circuit board 670, and thus extends beneath the bottom surface 650 of the first microelectronic element 644. In the first connection region 626, the inner surface 622 of the dielectric body faces upwardly, toward the first microelectronic element, whereas the outer surface 624 faces downward, toward the circuit board 670. The additional region extends outside of the gap, and overlies the top surface 652 of the first microelectronic element.

In place of the socket contacts discussed above, the adaptor of FIG. 12 has first conductive attachments 634 which include conductive pads disposed at or near the inner surface 622 of the body in the first connection region 626, and holes 630 extending through the body in alignment with these pads. Pads 634 desirably are relatively thin as, for example, about 10–20 micron in thickness. Pads or first conductive attachments 634 are connected by traces 642 to terminals 640 on the additional region 628.

Here again, the first microelectronic element 644 has bonding pads 658 exposed at its bottom surface. These bonding pads are connected by internal connecting elements 602 to the pads or conductive attachments 634 of the adaptor, which in turn are connected by mounting elements 662 to the contact pads 676 of the circuit board. Most preferably, the internal conducting elements are thin layers of a conductive bonding material such as solder lands. Desirably, the height $h_1$ of each internal conducting element, (FIG. 13) measured from the bottom surface 650 of the first microelectronic element to the bottom of the internal conducting element, is about 50 microns or less, and most preferably about 40 microns or less. The mounting elements 662 most preferably are masses of a conductive bonding material such as solder balls or solid core solder balls. The mounting elements may have height $h_2$ or vertical extent from the upper surface 672 of the circuit board considerably greater than the height $h_1$ of the internal connecting elements 602. For example, the height h2 of the mounting elements may be on the order of 100 to 300 microns. However, the assembly still provides a relatively low overall height or distance H between the top surface 672 of the circuit board and the bottom surface 650 of the first microelectronic element. Because the mounting elements 662 extend through holes 630 in body 620, a significant portion, typically about 25% or more, of the height $h_2$ of the mounting elements is concealed within the thickness t of body 620. Thus, the overall height or distance H from the board surface 672 to the bottom surface of the first microelectronic element is less than the aggregate or sum of heights h1, h2 and the thickness t of the body. Stated another way, the assembly according to this embodiment of the invention can provide a low overall height while allowing significant solder ball height. Such relatively large solder balls can provide enhanced resistance to strains due to differential thermal expansion of the elements.

In a variant of this approach, the conductive attachments 634 are disposed at or near the outer surface 624, and the internal connecting elements 602 extend from the first microelectronic element 644 partially or entirely through the thickness of the body to the conductive attachments. In this arrangement, the internal conductive elements may be elements such as solder balls or solid core solder balls having a relatively great height. The conductive attachments or pads 634 are connected to the contact pads of the circuit board by relatively thin mounting elements such as solder lands. In this variant, the roles of the internal connecting elements and mounting elements are reversed relative to the arrangement shown in FIGS. 12 and 13. Here again, however, height of the larger element (the internal connecting element) is substantially concealed within the thickness t of the body, so that the overall height H remains less than the sum of the heights of the internal connecting elements, the mounting elements and the thickness of the body. In a further variant, the conductive attachments may include conductive elements at both surfaces of the body defining sockets adapted to receive the mounting elements, the internal connecting elements, or both so that either or both of these are partially or entirely concealed within the thickness of the body. For example, sockets as depicted in certain preferred embodiments of U.S. Pat. No. 6,200,143, the disclosure of which is incorporated by reference, may be used in this manner.

Figure 12:
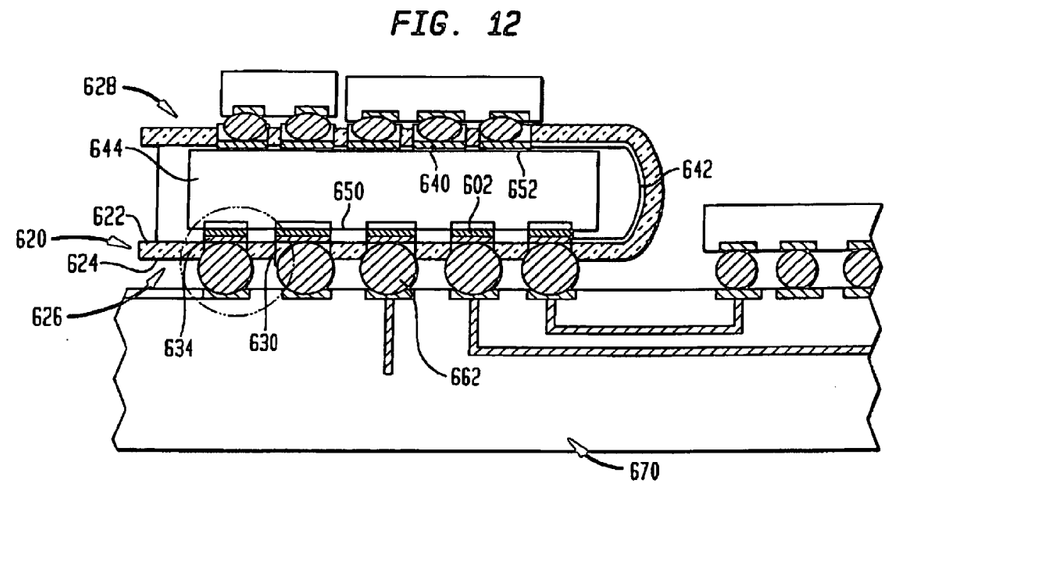
FIG. 12 is a view similar to FIG. 11 but depicting an assembly according to a further embodiment of the invention.
Figure 13:
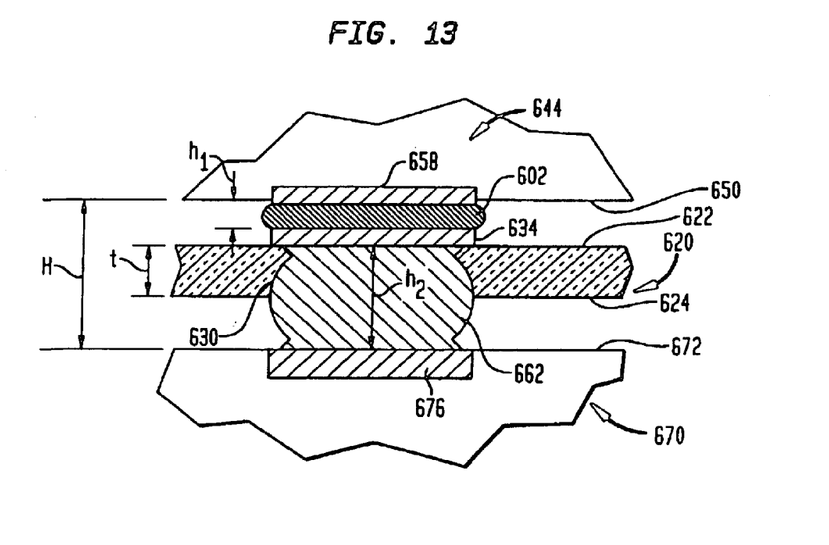
FIG. 13 is a diagrammatic sectional view on an enlarged scale of the area indicated in FIG. 12.
Figure 14:
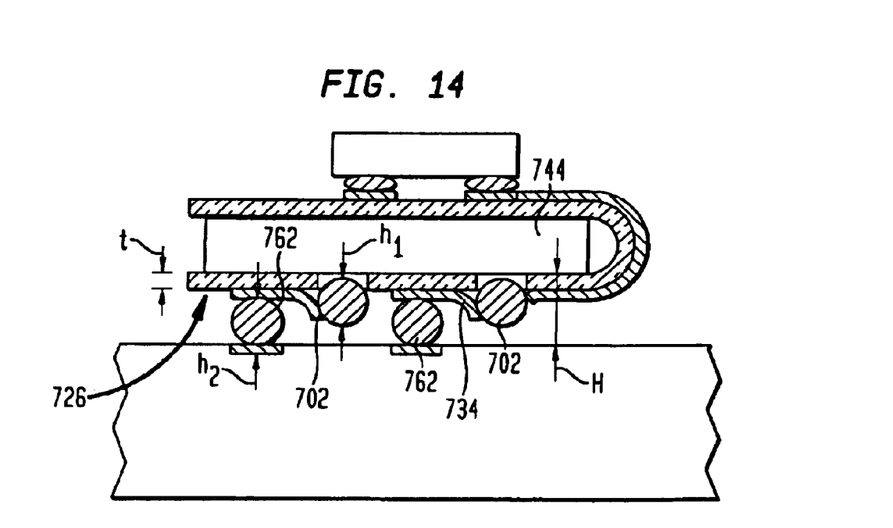
FIGS. 14 and 15 are further diagrammatic sectional elevational views depicting assemblies in accordance with further embodiments of the invention.

An assembly according to yet another embodiment of the invention (FIG. 14) is generally similar to the assembly of FIGS. 12 and 13. However, in the assembly of FIG. 14, the conductive attachments 734 are arranged so that the internal connecting elements 702 which connect the first microelectronic element 744 to the attachments are offset from the mounting elements 762 which connect the attachments to the contact pads of the circuit board. The height $h_1$ of the connecting elements overlaps a part of the height h2 of the mounting elements, a part of the thickness t of the body of the adaptor, or both. In this arrangement as well, the overall distance or height H from the top surface of the circuit board to the bottom surface of the first microelectronic element is less than the sum of h1, h2 and t. In one example of such as structure, the connecting region 726 may have a structure generally similar to the sockets shown in U.S. Pat. No. 5,951,305, the disclosure of which is also incorporated by reference herein.

Figure 15:
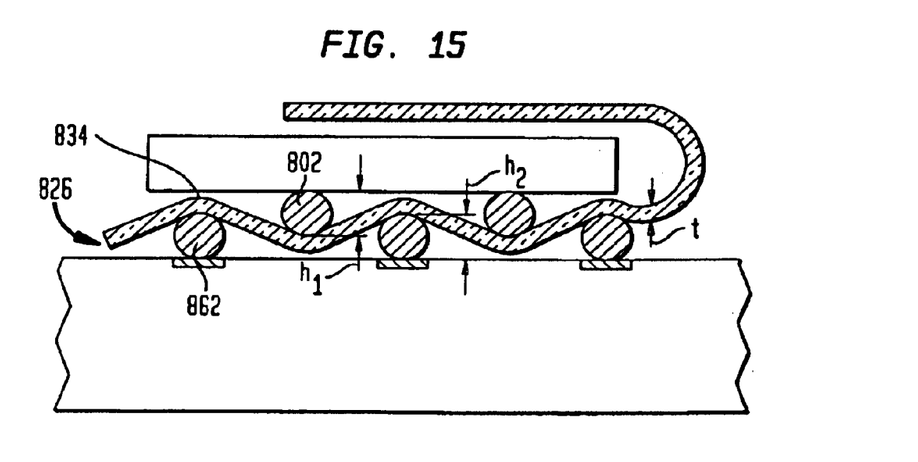

In yet another variant (FIG. 15) the, internal connecting elements are again offset in horizontal directions from the mounting elements 862. Here again, the internal connecting elements 802 make connections to conductive attachments 834 on the bottom or first connection region 826 of the adaptor body. This region of the body is deformed into a non-planar shape, so that once again the height h1 of the internal connecting elements overlaps the height h2 of the mounting elements, the thickness t of the body, or both. The configuration of this region may be similar to the configuration of the sockets shown in certain embodiments of U.S. Pat. No. 6,086,386, the disclosure of which is also incorporated by reference herein. The arrangements of FIGS. 14 and 15 can also provide a low overall height H of the first microelectronic element above the circuit board, and hence a low height for the entire assembly, while using internal conductive elements and/or mounting elements having substantial height. The mounting arrangements discussed above with reference to FIGS. 12–15 also can be used with any of the adaptor configurations discussed herein, including those discussed above with reference to FIGS. 7–11. Also, although the embodiments of FIGS. 12–15 have been discussed above with reference to the completed assembly, the present invention also includes the adaptors and assembly methods used to form these assemblies. The adaptors are similar to the adaptors discussed above, except that the socket contacts and socket regions are replaced by the conductive attachment elements and connection region. Also, the assembly methods are similar to those discussed above with reference to FIGS. 1–4, except that the bonding contacts of the first microelectronic element are connected to the conductive attachments of the adaptor, rather than directly to the circuit board contact pads, and the method includes the further step of connecting the conductive attachments of the adaptor to the circuit board contact pads.

Numerous other variations and combinations of the features discussed above can be utilized without departing from the present invention. For example, in the embodiments discussed above, the additional functional elements provided in the adaptor are either terminals (such as terminals 40 in FIG. 1) or additional semiconductor chips 478–481 (FIGS. 9 and 10). However, other functional elements such as passive electrical components may be incorporated in place of or in addition to these elements. In still other arrangements, the adaptor may extend beyond the circuit board. For example, the adaptor can extend around an edge of the circuit board to provide mounting terminals on the bottom or rear surface of the circuit board. Alternatively, the adaptor can be in the form of a ribbon cable which has functional elements in the form of contacts adapted to engage a socket on another circuit board or another electronic device.

Also, it is not essential that the substrate be thin or flexible throughout its entire extent. In those embodiments where bending or folding is required, the substrate may be flexible in only the regions to be deformed during bending or folding and may be rigid in other regions. In embodiments where the substrate will not be bent or folded, as, for example, in the arrangement of FIG. 8, the substrate may be entirely or partially rigid. Also, although the adaptors discussed above incorporate only a single layer of traces, additional metallic elements may be provided as desired. For example, the adaptor may include electrically conductive plane for carrying a ground or other substantially constant potential spaced apart from the traces. Also, more than one layer of traces may be incorporated in the adaptor to accommodate more complex wiring requirements. Connecting elements other than the solder balls and leads discussed above may be employed, as, for example, solid core solder balls and pins.

In the foregoing description, terms such as "top", "bottom", "upwardly" and "downwardly" refer to the frame of reference of the microelectronic element or circuit board. These terms do not refer to the normal gravitational frame of reference.

As these and other variations and combinations of the features discussed above can be utilized without departing from the present invention as defined by the claims, the foregoing description of the preferred embodiment should be taken by way of illustration rather than by way of limitation of the invention.

What is claimed is:

1. An adaptor for use with a first microelectronic package having a bottom surface, a top surface and an array of connection elements projecting downwardly beyond the bottom surface of said package, the adaptor comprising: a substrate having a first socket region with an inner surface and an outer surface, an array of socket openings extending through the substrate in said socket region, said socket openings being disposed in an array corresponding to the arrangement of connection elements on the microelectronic element, the adaptor further comprising a set of socket contacts aligned with at least some of said socket openings, said socket contacts and socket openings being arranged so that the package can be engaged with the adaptor with the bottom surface of the package confronting the inner surface of the substrate in said socket region and with the connection elements of the package engaged with the socket contacts and projecting through said socket openings beyond the outer surface of the substrate, the adaptor further including one or more functional elements electrically connected to at least some of said socket contacts.

2. An adaptor as claimed in claim 1 wherein said substrate has an attachment region remote from said first socket region, said substrate having inner and outer surfaces in said attachment region, said at least one functional element including a set of terminals exposed at one or both of said inner and outer surfaces in said attachment region so that when the microelectronic element is engaged with the adaptor and when said adaptor is in a predetermined configuration, said terminals are available for connection to a further microelectronic element.

3. An adaptor as claimed in claim 1 wherein said adaptor is constructed and arranged so that the substrate can be folded to place the attachment area over the top surface of the first microelectronic element with the outer surface of the substrate in the attachment region facing upwardly, away from the first microelectronic element, and wherein said terminals are exposed at said outer surface in said attachment region.

4. An adaptor as claimed in claim 3 wherein said substrate is generally in the form of an elongated strip having said first socket region adjacent one end of the strip and said attachment region at the opposite end of the strip.

5. A circuit panel assembly comprising:
 (a) a circuit panel having a top surface;
 (b) a first microelectronic element mounted on said circuit panel, said first microelectronic element having a bottom surface overlying said top surface of said circuit panel and defining a gap therebetween,
 (c) an array of connection elements extending from said first microelectronic element to said circuit panel; and
 (d) an adaptor having a substrate including a first socket region, said substrate having oppositely-directed inner and outer surface in said first socket region and first apertures extending between said inner and outer surfaces in said first socket region, said adaptor further having an array of first socket contacts aligned with at least some of said first apertures, said adaptor having at least one functional element electrically connected to at least some of said first socket contacts, said first socket region of said substrate extending at least partially in the gap between said bottom surface of said first microelectronic element and said top surface with said inner surface facing upwardly toward the bottom surface of the first microelectronic element, said connection elements extending through said apertures to said circuit panel and engaging said first socket contacts, whereby said at least one functional element is electrically connected to at least some of said connection elements.

6. A circuit panel assembly as claimed in claim 5 wherein said substrate has an additional region extending outside of said gap, said one or more one or more functional elements being disposed in said additional region.

7. A circuit panel assembly as claimed in claim 6 wherein said one or more functional elements include first terminals for connection of a further microelectronic element.

8. A circuit panel assembly as claimed in claim 7 wherein said first microelectronic element has a top surface and said additional region of said substrate overlies the top surface of the first microelectronic element.

9. A circuit panel assembly as claimed in claim 8 further comprising an additional microelectronic element connected to said first terminals and overlying said top surface of said first microelectronic element.

10. A circuit panel assembly as claimed in claim 8 wherein said substrate is a generally sheetlike element having said inner and outer surfaces extending to said additional region.

11. A circuit panel assembly as claimed in claim 10 wherein said first microelectronic element has edges extending between said top and bottom surfaces and said substrate is folded around a first one of said edges so that said inner surface confronts said top surface of said first microelectronic element and said outer surface faces upwardly, away from said first microelectronic element, said first terminals being exposed at said inner surface of said substrate.

12. A circuit panel assembly as claimed in claim 6 wherein said adaptor has inner and outer surfaces in said additional region and apertures extending between said inner and outer surfaces of said additional region, said functional element including second socket contacts aligned with at least some of said apertures in said additional region, at least some of said second socket contacts being electrically connected to at least some of said first socket contacts, the assembly further comprising a second microelectronic element having a bottom surface overlying the top surface of said circuit panel, said additional region extending between said second microelectronic element and said top surface of said circuit panel, the assembly further including second connecting elements extending between said second microelectronic element and said circuit panel and extending through said apertures in said additional region, at least some of said second connecting elements contacting at least some of said second socket contacts so that said second microelectronic element is connected to said first microelectronic element through said adaptor.

13. A circuit panel assembly as claimed in claim 12 wherein said substrate is a sheetlike element having inner and outer surfaces extending in said first socket region and in said additional region, the adaptor further including conductive traces extending along the sheetlike element between at least some of said first socket conductors and at least some of said second socket conductors.

14. A circuit panel assembly as claimed in claim 6 further comprising a second microelectronic element mounted to said circuit panel, said additional region overlying said second microelectronic element.

15. A circuit panel assembly as claimed in claim 5 wherein said first microelectronic element has bonding contacts exposed at the bottom surface of the first microelectronic element and said circuit panel has bonding contacts exposed at the top surface of the circuit panel, and wherein said connection elements include electrically conductive bonding material bonded to the bonding contacts of the first microelectronic element and to the bonding contacts of the circuit panel and to said first socket contacts.

16. A circuit panel assembly as claimed in claim 5 wherein said first microelectronic element has bonding contacts exposed at the bottom surface of the first microelectronic element and said circuit panel has bonding contacts exposed at the top surface of the circuit panel, and wherein said connection elements include solder masses bonded to the bonding contacts of the first microelectronic element and to the bonding contacts of the circuit panel and to said first socket contacts.

17. A circuit panel assembly as claimed in claim 5 wherein said connecting elements include leads projecting from the first microelectronic element and said circuit panel has lead sockets exposed at the top surface of the circuit panel, said leads being engaged in said lead sockets.

18. A circuit panel assembly as claimed in claim 5 wherein said first surface of said substrate abuts said bottom surface of said first microelectronic element and said second surface of said substrate is spaced apart from said top surface of said circuit panel.

19. A method of making a microelectronic subassembly comprising the step of mounting an adaptor to a first microelectronic element so that a first socket region of the adaptor is juxtaposed with a bottom surface of the first microelectronic element with an inner surface of the first socket region facing toward such bottom surface and an outer surface of the first socket region facing away from the bottom surface, and so that connecting elements extend from the first microelectronic element through apertures in the first socket region of the adaptor and extend beyond the outer surface of the first socket region, and so that at least some of said connecting elements contact first socket contacts on the adaptor, said adaptor having a functional element electrically connected to said first socket contacts.

20. A method as claimed in claim 19 wherein said functional elements includes terminals, the method further comprising the step of connecting a second microelectronic element to at least some of said terminals.

21. A method as claimed in claim 20 wherein said adaptor includes a substrate bearing said socket contacts and said terminals and having electrically conductive traces extending between said socket contacts and said terminals, the method further comprising the step of folding said substrate so that said terminals overlie a top surface of the first microelectronic element.

22. A method as claimed in claim 20 further comprising the step of connecting said first microelectronic element to a circuit panel by engaging said connecting elements with mating elements on the circuit panel.

23. A method as claimed in claim 22 wherein said connecting elements include a bonding material, and wherein said connecting step includes bonding said bonding material to bonding contacts on the circuit panel.

24. A method as claimed in claim 22 wherein said step of connecting said second microelectronic element to said terminals is performed before said step of connecting said first microelectronic element to said circuit panel.

25. A method as claimed in claim 22 wherein said step of connecting said second microelectronic element to said terminals is performed after said step of connecting said first microelectronic element to said circuit panel.

26. A method as claimed in claim 22 further comprising the step of repeating said steps using substantially identical first microelectronic elements in a plurality of repetitions, the second microelectronic elements used in at least some repetitions being different from the second microelectronic elements used in at least some other repetitions.

27. A circuit panel assembly comprising:

(a) a circuit panel having a top surface;

(b) a first microelectronic element mounted on said circuit panel, said first microelectronic element having a bottom surface overlying said top surface of said circuit panel and defining a gap therebetween, (c) an adaptor having a substrate including a first connection region, said substrate having oppositely-directed inner and outer surfaces in said first connection region and a thickness between said inner and outer surfaces, and first conductive attachments thereon, said adaptor having at least one functional element electrically connected to at least some of said first conductive attachments, said first connection region of said substrate extending at least partially in the gap between said bottom surface of said first microelectronic element and said top surface of said circuit panel with said inner surface facing upwardly toward the bottom surface of the first microelectronic element;

(d) internal connection elements extending between said first microelectronic element and said first conductive attachments, said internal connection elements having a first height; and (e) mounting elements extending between said first conductive attachments and said contact pads, said mounting elements having a second height, said first microelectronic element being disposed at a height above said top surface of said circuit panel less than the sum of said first height, said second height and said thickness of said first connection region.

28. A circuit panel assembly as claimed in claim 27 wherein said first conductive attachments are disposed adjacent the inner surface of said first connection region and wherein said mounting elements extend at least partially through said first connection region.

29. A circuit panel assembly as claimed in claim 28 wherein said internal connection elements are solder lands, and said mounting elements are solder balls.

30. A circuit panel assembly comprising:

(a) a circuit panel having a top surface;

(b) a first microelectronic element mounted on said circuit panel, said first microelectronic element having a bottom surface overlying said top surface of said circuit panel and defining a gap therebetween, (c) an adaptor having a substrate including a first connection region, said substrate having oppositely-directed inner and outer surfaces in said first connection region and a thickness between said inner and outer surfaces, and first conductive attachments thereon, said adaptor having at least one functional element electrically connected to at least some of said first conductive attachments, said first connection region of said substrate extending at least partially in the gap between said bottom surface of said first microelectronic element and said top surface of said circuit panel with said inner surface facing upwardly toward the bottom surface of the first microelectronic element;

(d) internal connection elements extending between said first microelectronic element and said first conductive attachments, said internal connection elements having a first height; and (e) mounting elements extending between said first conductive attachments and said contact pads, said mounting elements having a second height, said first microelectronic element being disposed at a height above said top surface of said circuit panel less than the sum of said first height, said second height and said thickness of said first connection region, wherein said internal connection elements and said mounting elements are offset from one another in one or more horizontal directions.

31. A circuit panel assembly as claimed in claim 30 wherein said first connection region is bent vertically between said internal connection elements and said mounting elements.

32. A circuit panel assembly as claimed in claim 27 wherein said substrate has an additional region extending outside of said gap, said one or more one or more functional elements being disposed in said additional region.

33. A circuit panel assembly as claimed in claim 32 wherein said one or more functional elements include first terminals for connection of a further microelectronic element.

34. A circuit panel assembly comprising:

(a) a circuit panel having a top surface;

(b) a first microelectronic element mounted on said circuit panel, said first microelectronic element having a bottom surface overlying said top surface of said circuit panel and defining a gap therebetween, (c) an adaptor having a substrate including a first connection region, said substrate having oppositely-directed inner and outer surfaces in said first connection region and a thickness between said inner and outer surfaces, and first conductive attachments thereon, said adaptor having at least one functional element electrically connected to at least some of said first conductive attachments, said first connection region of said substrate extending at least partially in the gap between said bottom surface of said first microelectronic element and said top surface of said circuit panel with said inner surface facing upwardly toward the bottom surface of the first microelectronic element;

(d) internal connection elements extending between said first microelectronic element and said first conductive attachments, said internal connection elements having a first height; and (e) mounting elements extending between said first conductive attachments and said contact pads, said mounting elements having a second height, said first microelectronic element being disposed at a height above said top surface of said circuit panel less than the sum of said first height, said second height and said thickness of said first connection region, wherein said substrate has an additional region extending outside of said gap, said one or more one or more functional elements being disposed in said additional region, said one or more functional elements including first terminals for connection of a further microelectronic element, said first microelectronic element having a top surface and said additional region of said substrate overlying the top surface of the first microelectronic element.

35. A circuit panel assembly as claimed in claim 34 further comprising an additional microelectronic element connected to said first terminals and overlying said top surface of said first microelectronic element.

36. A circuit panel assembly as claimed in claim 35 wherein said substrate is a generally sheetlike element having said inner and outer surfaces extending to said additional region.

37. A circuit panel assembly as claimed in claim 36 wherein said first microelectronic element has edges extending between said top and bottom surfaces and said substrate is folded around a first one of said edges so that said inner surface confronts said top surface of said first microelectronic element and said outer surface faces upwardly, away from said first microelectronic element in said additional region.

38. A circuit panel assembly comprising:
(a) a circuit panel having a top surface and contact pads exposed at said top surface;
(b) a first microelectronic element mounted on said circuit panel, said first microelectronic element having a bottom surface overlying said top surface of said circuit panel and defining a gap therebetween;
(c) an adaptor having a substrate including a first connection region, said substrate having oppositely-directed inner and outer surfaces in said first connection region and a thickness between said inner and outer surfaces, and first conductive attachments in said first connection region, said adaptor having at least one functional element electrically connected to at least some of said first conductive attachments, said first connection region of said substrate extending at least partially in the gap between said bottom surface of said first microelectronic element and said top surface of said circuit panel with said inner surface facing upwardly toward the bottom surface of the first microelectronic element;
(d) solder lands connecting said first microelectronic element to said first conductive attachments; and
(e) solder balls connecting said first conductive attachments to said top surface of said circuit panel, said solder balls extending at least partially through said substrate.

39. An assembly as claimed in claim 38 wherein said first conductive attachments include pads disposed at the inner surface of said substrate in said first connection region and said solder balls extend entirely through the substrate.

40. A method of making a microelectronic assembly comprising the steps of:
(a) mounting an adaptor to a first microelectronic element so that a first connection region of the adaptor is juxtaposed with a bottom surface of the first microelectronic element with an inner surface of the first connection region facing toward such bottom surface and an outer surface of the first socket region facing away from the bottom surface and so that internal connecting elements extend from the first microelectronic element to conductive attachments on said first connection region of the adapter; and
(b) mounting the adaptor to a circuit board so that mounting elements extend from said first conductive attachments to contact pads on a circuit board, said mounting steps being performed so that said mounting elements,
said internal connecting elements, or both extend at least partially through apertures in the first connection region of the adaptor, said adaptor having a functional element disposed outside of said first connection region electrically connected to at least some of said first conductive attachments.

41. A method as claimed in claim 40 wherein said functional element includes a set of terminals, the method further comprising the step of connecting a second microelectronic element to at least some of said terminals.

* * * * *

UNITED STATES PATENT AND TRADEMARK OFFICE
CERTIFICATE OF CORRECTION

PATENT NO. : 6,765,288 B2
DATED : July 20, 2004
INVENTOR(S) : Philip Damberg

Page 1 of 1

It is certified that error appears in the above-identified patent and that said Letters Patent is hereby corrected as shown below:

Column 14,
Line 51, "outer surface" should read -- outer surfaces --.

Column 15,
Line 3, "said one or more one or more" should read -- said one or more --.

Column 16,
Line 35, "elements includes" should read -- element includes --.

Column 18,
Line 12, "said one or more one or more" should read -- said one or more --.
Line 49, "said one or more one or more" should read -- said one or more --.

Signed and Sealed this

Fourteenth Day of December, 2004

JON W. DUDAS
*Director of the United States Patent and Trademark Office*